United States Patent [19]

Connolly, Jr. et al.

[11] 4,338,590
[45] Jul. 6, 1982

[54] MULTI STAGE RESISTIVE LADDER NETWORK HAVING EXTRA STAGES FOR TRIMMING

[75] Inventors: Joseph J. Connolly, Jr., San Jose; James B. Cecil, Santa Clara, both of Calif.

[73] Assignee: National Semiconductor Corporation, Santa Clara, Calif.

[21] Appl. No.: 110,135

[22] Filed: Jan. 7, 1980

[51] Int. Cl.³ .............................................. H03K 13/02
[52] U.S. Cl. .............................. 340/347 CC; 338/195; 340/347 DA; 340/347 M
[58] Field of Search ..... 340/347 M, 347 CC, 347 DA

[56] References Cited

U.S. PATENT DOCUMENTS

| | | | |
|---|---|---|---|
| 3,890,610 | 6/1975 | Cahen | 340/347 M X |
| 4,070,665 | 1/1978 | Glennon et al. | 318/569 X |
| 4,138,671 | 2/1979 | Comer et al. | 307/241 X |
| 4,150,366 | 4/1979 | Price | 340/347 M X |

OTHER PUBLICATIONS

The Engineering Staff of Analog Devices, Inc., Analog-Digital Conversion Handbook, 6/1972, pp. I-55 to I-61; II-34 to II-38; II-71 through II-74.
Barnes, First Monolithic 12-Bit DAC Uses A New Zener Trim Technique, Electronic Design 4, 15 Feb. 1977, pp. 34-35.

Primary Examiner—Thomas J. Sloyan
Attorney, Agent, or Firm—Gail W. Woodward; James A. Sheridan; Neil B. Schulte

[57] ABSTRACT

A multi-stage resistive ladder network which uses extra stages to trim out resistance discrepencies. All of the stages are interconnected in a series. Nominally, current is divided in half within each stage. Half of the current is gated onto a bus in response to logic control signals, and the other half of the current is passed onto the next succeeding stage. Due to various processing limitations, the resistors comprising each stage vary slightly from their nominal value, which in turn upsets the current division. To compensate for this additional current dividing stages are serially connected to the last stage of the ladder. Current from these additional stages are selectively coupled onto the bus in response to the logic signals in addition to the current which is normally coupled thereto.

2 Claims, 5 Drawing Figures

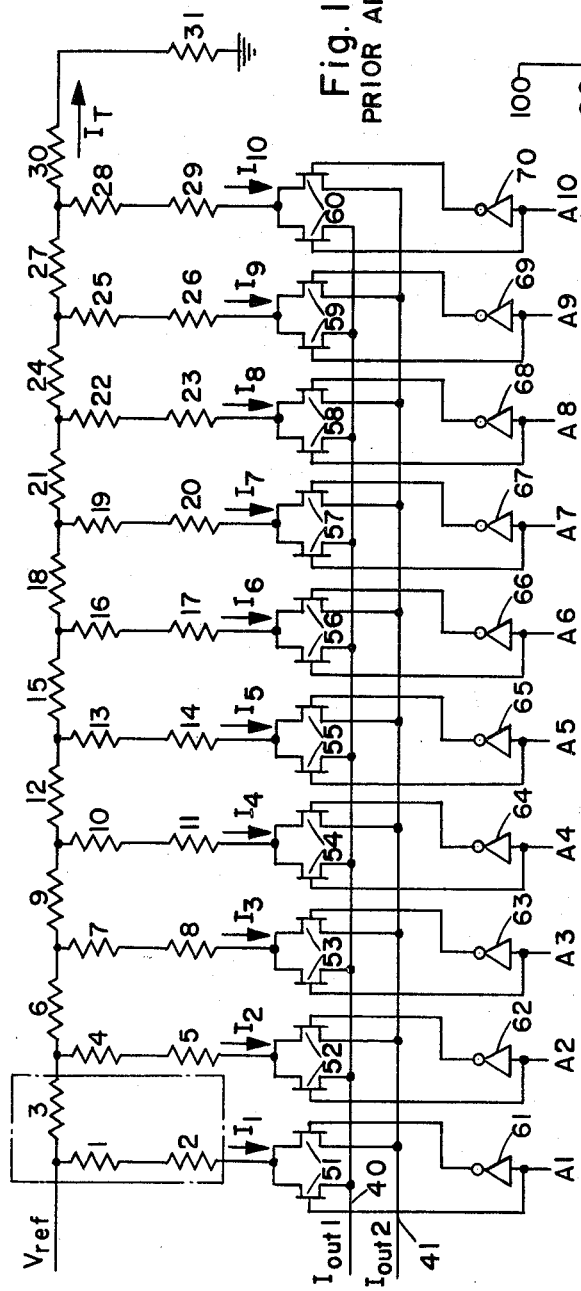
Fig. 1 PRIOR ART
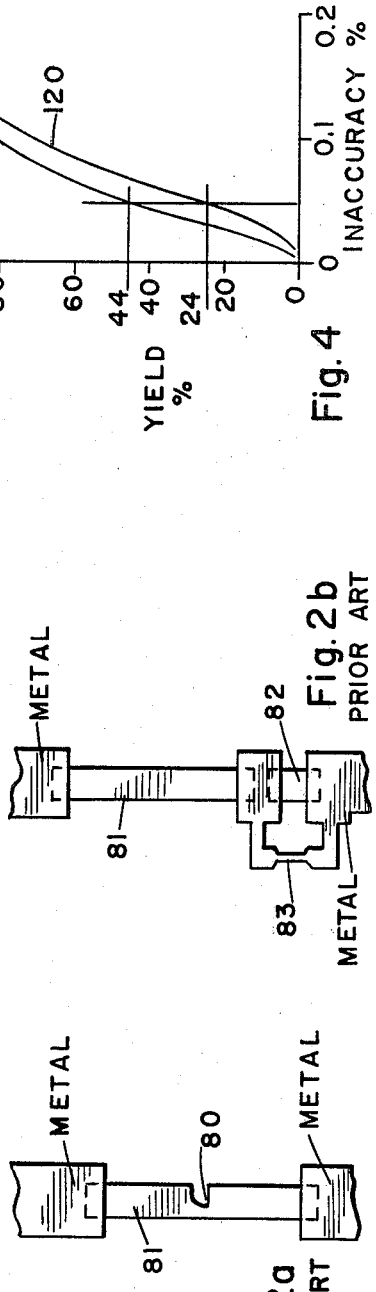
Fig. 4
Fig. 2b PRIOR ART
Fig. 2a PRIOR ART

MULTI STAGE RESISTIVE LADDER NETWORK HAVING EXTRA STAGES FOR TRIMMING

BACKGROUND OF THE INVENTION

This invention relates to resistive ladder networks; and more particularly to circuits for compensating for inaccuracies caused by resistive variations within the ladder. These resistance variations are unintentional, and are due to various processing limitations. In an ideal ladder network having no resistance variations, current is precisely divided in two as it passes from stage to stage. However, in an actual ladder network, resistance variations within the stages cause this current division to be upset somewhat.

In the past, various circuits and methods have been devised to "trim" the actual resistors to their nominal value. One such prior art method is known as laser trimming. Basically, with this method, portions of the thin film that comprises the resistor are selectively removed by a laser beam. In another prior art method, small resistive regions are selectively added in series to a large resistive region that is to be trimmed. Both of these methods, however, are unsatisfactory for various reasons which are explained in greater detail in the Detailed Description portion of this disclosure.

Therefore, it is a primary object of the invention to provide a resistive ladder network with an improved resistance trimming circuit.

BRIEF SUMMARY OF THE INVENTION

This and other objects are accomplished in accordance with the invention by a resistive ladder network that contains a plurality of stages. Each of the stages has an input node, a first output node and a second output node. The nominal resistance from the input node to the first output node is of the same value for each stage; and the nominal resistance from the input node to the second output node is twice that value. However, the actual resistance between the input and output nodes varies slightly from the nominal resistance due to various processing limitations.

All of the stages are connected in series such that the first output node of one stage connects to the input node of the next succeeding stage. A pair of conductive buses run alongside of the stages. A first circuit receives externally generated logic signals to selectively couple current from the second output nodes onto the output buses in response thereto. A second circuit partitions current that exits from the first output node of the last stage into portions thereof. And a third circuit selectively couples the partitioned current onto the output buses in response to the logic signals. This partitioned current adds to the current that is gated there by the first circuit. The total current approximates that which would be gated onto the buses by the first circuit if the resistance of the stages were at their nominal value.

BRIEF DESCRIPTION OF THE DRAWINGS

A preferred embodiment of the invention, as well as a prior art embodiment for comparison purposes, is described in the accompanying drawings wherein:

FIG. 1 is a detailed circuit diagram of a prior art resistive ladder network.

FIGS. 2a and 2b illustrate prior art trimming mechanisms for the FIG. 1 circuit.

FIG. 4 is a set of curves comparing the accuracy of the FIG. 1 and FIG. 3 circuits.

DETAILED DESCRIPTION

Figure 3:
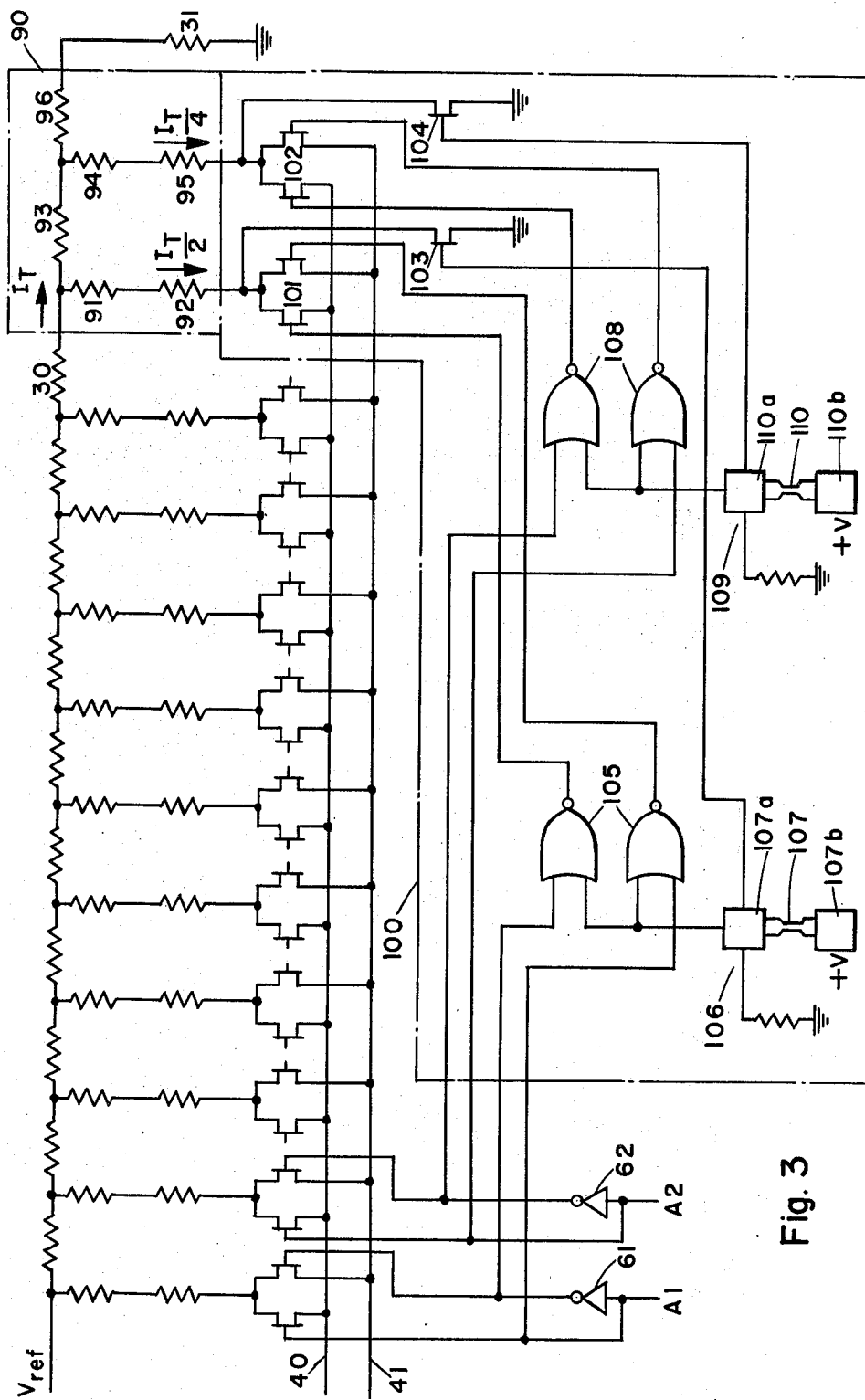
FIG. 3 is a detailed circuit diagram of a preferred embodiment of the invention.

In order to help explain the present invention, a prior art resistive ladder network will first be described in detail. This prior art ladder is illustrated in FIG. 1. It includes resistors 1 through 31 which are interconnected as a plurality of stages. The first stage is formed by resistors 1, 2 and 3; the second stage is formed by resistors 4, 5 and 6; etc.

Each of the resistors 1 through 31 have the same nominal resistance. This nominal resistance may be 10 Kohms for example. As a result, current is divided in two as it passes through each of the stages. That is, current flow starts by entering the first stages input node as formed by the connection between resistors 1 and 3. There the current is divided in two. Half of the current exits the stage through resistor 3, and the other half of the current exits through resistors 1 and 2. This current division process is repeated for each of the following stages.

Due to this current division, the current $I_1$ from the first stage, is two times the current $I_2$ from the second stage, four times the current $I_3$ from the third stage, ... 512 times the current $I_{10}$ from the tenth stage. Also, by symmetry, the current which passes through resistors 30 and 31 is equal to current $I_{10}$. In the prior art, this current was "thrown away" by returning it to ground. Thus, in FIG. 1, the "throw away current" is indicated as $I_T$. By comparison, the present invention utilizes current $I_T$ in a manner which compensates for variations in the resistances 1 through 31.

The exact manner in which the above mentioned compensation is performed will be described shortly in conjunction with FIGS. 3 and 4. But first the other components of the FIG. 1 circuit remain to be described. They include a pair of conductive buses 40 and 41. The currents $I_1$ through $I_{10}$ are selectively coupled onto these buses by means of a plurality of transistor pairs 51 through 60. These transistors are driven by complementary logic signals such that one transistor within each pair is selectively turned on while the other transistor is turned off. The complementary signals are formed by logic gates 61 through 70, which invert signals $A_1$ through $A_{10}$.

Due to various processing limitations, resistors 1 through 31 generally differ somewhat from their nominal value. As a result, the currents $I_1$ through $I_{10}$ do not precisely differ from one another by powers of 2. This in turn gives rise to inaccuracies in the digital to analog conversion process.

FIGS. 2a and 2b illustrate two prior art techniques to compensate for these inaccuracies. The technique illustrated in FIG. 2a is known as laser trimming. With laser trimming, a portion 80 of the thin film 81 which make up one of the resistors 1 through 31 is removed by a laser beam. Film 81 may be comprised of SiCr for example.

One problem with laser trimming, however, is that it limits the minimum geometry that can be used for the resistors. Otherwise, precision trimming is not possible. Another problem is that laser trimmed resistors generally do not have long term stability. That is because during the trimming process, cracks develop in the film 81, near the removed portion 80. And these cracks change in size with time, which in turn change the film resistance.

The prior art compensating technique of FIG. 2b uses a small trim resistor 82 which can be added in series with resistance 81 by blowing a metal fuse 83. This technique, however, requires large ratios between the geometry of the film 81 and 82. And it is usually difficult to achieve accurate resistance ratios in this manner. Therefore, some calibration scheme is generally required to determine the effect of adding the trim resistor.

Referring now to FIG. 3, a preferred embodiment of the invention will be described. Basically, it includes all of the components in FIG. 1, and in addition, it includes a circuit 90 and a circuit 100. Circuit 90 operates to partition the throw away current $I_T$, while circuit 100 operates to selectively couple the partitioned current onto the output buses 40 and 41 in response to the logic signals $A_1$ and $A_2$.

The current partitioning in circuit 90 is performed by resistors 91 through 96. These resistors are identical in geometry and resistive value to resistors 1 through 31. Also, they are interconnected in stages which are identical to stages 1 through 10. Resistors 91, 92 and 93 form one stage, and resistors 94, 95 and 96 form another stage.

Due to symmetry, the current which exits resistor 92 is precisely $I_T$ divided by 2. Also, the current which exits resistor 95 is precisely $I_T$ divided by 4. No calibration is needed to determine the magnitude of these currents. They are then selectively gated onto buses 40 and 41 by MOS transistor pairs 101, 102. Transistors 101 are enabled when current $I_1$ is low. Similarly, transistors 102 are enabled when the current $I_2$ is low.

Transistors 101 are enabled and disabled by signals from a pair of logical NOR gates 105. These gates have a common input from a voltage divider network 106 which includes a fuse 107. When the fuse is not blown, the output of gates 105 is low, and transistors 101 turn off. At the same time, the gate of a transistor 103 is high. And thus transistor 103 turns on to bypass current $I_T/2$ away from the buses.

Conversely, when fuse 107 is blown, voltage divider network 106 forces the gate of transistor 103 to ground. Thus, transistor 103 turns off, and the output of gates 105 switch in response to signal $A_1$. Transistors 101 then direct current $I_T/2$ to either bus 40 or bus 41 in response to signal $A_1$.

Transistors 102 and 104 operate in a similar manner. That is, they are controlled by a pair of logical NOR gates 108 corresponding to gates 105, a voltage divider network 109 corresponding to fuse 107. When fuse 110 is not blown, current $I_T/4$ bypasses the buses 40 and 41; and when fuse 110 is blown, current $I_T/4$ is gated onto either bus 40 or 41 in response to signal $A_2$.

In order to allow fuse 107 to be blown, pads 107a and 107b are provided on either side thereof. Similarly, pads 110a and 110b are provided on either side of fuse 110. The pads provide a contact point through which a current that is large enough to blow the fuse can be passed during the final stages of the fabrication process. This fuse blowing, programs circuit 100 in a manner which is completely transparent to the chips ultimate user.

From the above, it is clear fuse 107 should be blown if current $I_1$ is too small. But what if current $I_1$ is too large? If that occurs, and the current $I_2$ is too small, this can be compensated for by blowing fuse 110. Which in turn will make $I_2$ more nearly equal to $\frac{1}{2}$ of current $I_1$.

Thus, the desired compensation is again achieved. If both $I_1$ and $I_2$ are too large, no compensation is possible.

It should also be pointed out that under usual operating conditions, buses 40 and 41 are connected to the inputs of a differential operational amplifier. These amplifiers have a large gain which forces their input to a virtual ground. Thus, in operation, buses 40 and 41 are at nearly the same potential as the sources of transistors 103 and 104. Therefore, the impedance through which the throw away current $I_T$ passes always remains unchanged regardless of which of the fuses are blown. This is important because otherwise the step of blowing the fuse would alter the impedances of the entire ladder network.

Reference should now be made to FIG. 4, where the accuracy of the FIG. 3 circuit is compared against the accuracy of the FIG. 1 circuit. In FIG. 4, percent accuracy is plotted on the horizontal axis, and the percentage of parts which had the corresponding accuracies are plotted on the vertical axis. Curve 120 corresponds to the parts prior to the programming of circuit 100, and curve 121 corresponds to the parts after they were programmed. Clearly, a significant improvement occurred. For example, prior to programming only 24 percent of the parts were better than 0.05 percent accurate; whereas after the programming, 44 percent of the parts were between than 0.05 percent accurate.

A preferred embodiment of the invention has now been described in detail. In addition, many changes and modifications can be made to these details without departing from the nature and spirit of the invention. For example, any number of stages can be included in the resistive ladder network. Similarly, any number of stages can be included within circuit 90. Also, the logic within circuit 100 could be modified such that any portion of the partitioned current $I_T$ can be added to current $I_1$, or to current $I_2$, etc. This would be performed simply by reorganizing the logic gates and their fused input signals within circuit 100. Therefore, since many changes can be made to the preferred embodiment of FIG. 3 without departing from the spirit of the invention, it is to be understood that the invention is not limited to that embodiment, but is defined by the appended claims.

We claim:

1. Apparatus for performing digital to analog voltage conversions, said apparatus being comprised of
a resistive ladder network containing a plurality of stages; each of said stages having an input node, a first output node, and a second output node; the nominal resistance from said input node to said first output node being of the same value for each stage, and the nominal resistance from said input node to said second output node being of twice said value for each stage; the actual resistance between said input and output nodes varying slightly from said nominal resistance due to various processing limitations; all of said stages being interconnected in series such that said first output node of one stage connects to said input node of the next succeeding stage;
a first conductive bus and a second conductive bus;
means for receiving externally generated logic signals and for selectively coupling said second output nodes to said output buses in response thereto to cause current to flow from said selectively coupled second output nodes to said output buses;

means for partitioning any current that exits from said first output node of the least significant bit stage of said series; and means for selectively coupling said partitioned current onto said output buses in response to said logic signals to thereby compensate for any said variations in resistance that causes the current that flows from the second output node of the most significant bit stage to be disproportionately small;

wherein the selective coupling means includes first transistors for selectively coupling said partitioning means to said conductive buses;

logic means responsive to said logic signals for turning said first transistors on and off in response to said logic signals to cause the partitioned current to flow to said first output bus when current flows from the second output node of said most significant bit stage to said first conductive bus;

a second transistor connected to said partitioning means for selectively diverting the partitioned current to circuit ground; and programmable means coupled to the logic means and the second transistor for selectively either (a) inhibiting said logic means from turning on and off said first transistors and simultaneously enabling said second transistor to divert the partitioned current or (b) enabling said logic means for turning on and off said first transistors and simultaneously inhibiting said second transistor from diverting the partitioned current;

wherein said first and second conductive buses are connected to the inputs of a differential amplifier having a large gain which forces said inputs to a virtual ground and causes the conductive buses to be at nearly the same potential at all times as the potential at the connection of said second transistor to said partitioning means when the partitioned current is diverted so that the impedance through which the partitioned current passes remains unchanged regardless of the selected state of the programmable means.

2. Apparatus according to claim 1, wherein the programmable means includes a pad connected to the inputs of said logic means and the gate of said second transistor;

a fuse connected between said pad and a first voltage reference source for inhibiting said logic means from turning on and off said first transistors and simultaneously enabling said second transistor to divert the partitioned current when said fuse is intact; and circuit means connected between said pad and a second voltage reference source for enabling said logic means to turn on and off said first transistors and simultaneously inhibiting said second transistor from diverting the partitioned current when said fuse is not intact.

* * * * *